(12) United States Patent
Suzuki

(10) Patent No.: US 7,358,605 B2
(45) Date of Patent: Apr. 15, 2008

(54) HEAT DISSIPATION STRUCTURE FOR ELECTRONIC DEVICE

(75) Inventor: Tatsuya Suzuki, Tokyo (JP)

(73) Assignee: Olympus Corporation, Tokyo (JP)

( * ) Notice: Subject to any disclaimer, the term of this patent is extended or adjusted under 35 U.S.C. 154(b) by 315 days.

(21) Appl. No.: 11/062,708

(22) Filed: Feb. 22, 2005

(65) Prior Publication Data

US 2005/0184386 A1 Aug. 25, 2005

Related U.S. Application Data

(63) Continuation of application No. PCT/JP2005/002667, filed on Feb. 15, 2005.

(30) Foreign Application Priority Data

Feb. 23, 2004 (JP) ............ P2004-046119

(51) Int. Cl.
*H01L 23/34* (2006.01)
*H01L 21/00* (2006.01)
*H05K 7/20* (2006.01)

(52) U.S. Cl. .............. 257/706; 257/712; 257/717; 257/720; 257/729; 257/E23.103; 361/709; 361/710; 438/122

(58) Field of Classification Search ............... None
See application file for complete search history.

(56) References Cited

FOREIGN PATENT DOCUMENTS

| | | |
|---|---|---|
| EP | 0 391 020 | 1/1990 |
| EP | 1 473 193 | 11/2004 |
| JP | 58-020540 | 8/1983 |
| JP | 04-113695 | 4/1992 |
| JP | 10-304034 | 11/1998 |
| JP | 11-026969 | 1/1999 |
| JP | 11-097871 | 4/1999 |
| JP | 2002-127108 | 5/2002 |
| JP | 2002-280774 | 9/2002 |
| JP | 2002-305392 | 10/2002 |
| JP | 2003-309385 | 10/2003 |
| WO | 03/021921 | 3/2003 |
| WO | 2005/055564 | 6/2005 |

*Primary Examiner*—Alonzo Chambliss
(74) *Attorney, Agent, or Firm*—Hogan & Hartson LLP

(57) ABSTRACT

A heat dissipation structure for an electronic device comprises a plurality of covering members made of a compressed wooden material, and a metal heat dissipation frame held between the covering members, and a portion of the heat dissipation frame is exposed outside of the electronic device.

4 Claims, 3 Drawing Sheets

HEAT DISSIPATION STRUCTURE FOR ELECTRONIC DEVICE

PRIORITY CLAIM

This application is a continuation application of a PCT Application No. PCT/JP2005/002667, filed Feb. 15, 2005, entitled "HEAT DISSIPATION STRUCTURE FOR ELECTRONIC DEVICE", Agent Reference No. PC-9390, whose priority is claimed on Japanese Patent Application No. 2004-46119, filed Feb. 23, 2004. The content of both the PCT Application and the Japanese Application is incorporated herein by reference.

BACKGROUND OF THE INVENTION

1. Field of the Invention

The invention relates to a heat dissipation structure for an electronic device.

2. Description of Related Art

Recently, various kinds of electronic devices are on the market. Since the electronic parts built in the electronic devices generate heat by consuming electric power, this situation, if left as it is, may harm the soundness of parts through reducing the function of the electronic devices or the like. Because of this, a structure is necessary in which the heat of the inside of the electronic devices is dissipated to the outside thereof.

As a heat dissipation technique, various kinds of proposals have been made. For example, see Unexamined Japanese Patent Publication Hei 11-26969.

As a covering member for various kinds of electronic devices, recently synthetic resin or light metal has been used in many cases. Synthetic resin or light metal has the advantages that it is strong and have good appearance, but has the disadvantages that it is somewhat cold and cheap-looking.

Accordingly, a proposal has been made that a wooden material such as wood or bamboo be used as a covering member for various kinds of electronic devices, because the wooden material is comfortable in the hand and provides soft sensation as it is used.

SUMMARY OF THE INVENTION

One aspect of the invention relates to a heat dissipation structure for an electronic device. The heat dissipation structure comprises a plurality of covering members made of a compressed wooden material; and a metal heat dissipation frame held between the covering members, a portion of the heat dissipation frame being exposed outside of the electronic device.

Preferably, the portion of the heat dissipation frame exposed outside includes at least one fin.

Advantageously, the portion of the heat dissipation frame exposed outside is positioned inward with respect to the outer surface of the covering member.

Preferably, the portion of the heat dissipation frame exposed outside is provided as an accent to constitute a design for the covering material.

DETAILED DESCRIPTION OF THE INVENTION

EMBODIMENT 1

Referring the drawings, a heat dissipation structure for electronic devices of a first embodiment in accordance with the invention will be discussed. In the embodiment, the heat dissipation structure for electronic devices is applied to a digital camera.

Figure 1:
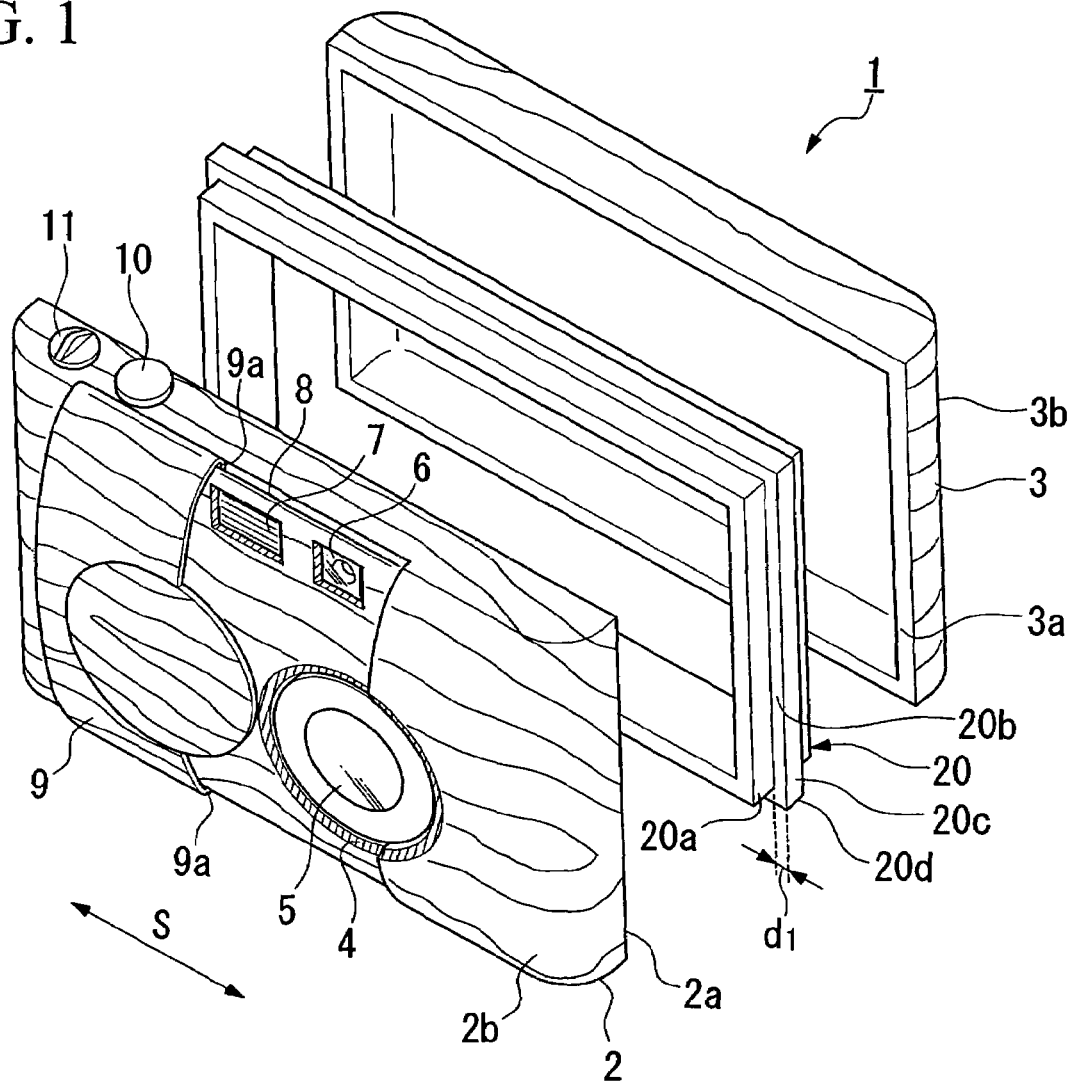
FIG. 1 is an exploded perspective view of a digital camera as a first embodiment to which a heat dissipation structure for electronic devices in accordance with the invention is applied.

In FIG. 1, reference numeral 1 denotes a digital camera of a first embodiment in accordance with the invention.

The digital camera 1, as shown in FIG. 1, is constituted of a front case (a covering member) 2 and a rear case (a covering member) 3, with the front case 2 combined with the rear case 3.

The front case 2 and the rear case 3 are made of a wooden material such as Japanese cypress, paulownia, teak, mahogany, Japanese cedar, pine, cherry, bamboo, or equivalents and are formed in a rectangular shape. The front case 2 has a round aperture 4 formed therein, through which a lens 5 is mounted. In the vicinity of the lens 5 and in the vicinity of an end in a width direction of the front case 2 are provided a finder 6 and a flashlight 7.

In addition, at both ends in the width direction of the front case 2, a long groove 8 is formed, respectively, in the length direction of the front case 2, i.e., in an arrow S direction. Through these two long grooves 8, a slide cover 9 made of a wooden material is mounted with the front case 2. That is, the slide cover 9 has nails 9a provided at both ends thereof, respectively. Since these nails 9a are engaged with the long grooves 8, respectively, the slide cover 9 is supported movable reciprocally in the arrow S direction. When the slide cover 9 is slid to a position to correspond with a lens 5 by pressing through the index finger, namely, the slide cover 9 is closed, the lens 5 is covered so that the surface thereof may be protected. On the other hand, when the slide cover 9 is slid to a position to expose the lens 5 outside, that is, the slide cover 9 is opened, the digital camera 1 is ready to shoot through the exposed lens 5.

Reference numeral 10 denotes a shutter button, and reference numeral 11 denotes a zoom button.

Moreover, the digital camera 1 in this embodiment comprises a heat dissipation frame 20 arranged between the front case 2 and the rear case 3. The heat dissipation frame 20, made of metal such as aluminum and magnesium, is formed in a rectangular frame shape. The inner portion of the heat dissipation frame 20 is designed to accept a substrate 30 shown in FIG. 2 on which various kinds of electronic components are fixed. On an outer peripheral surface 20a of the heat dissipation frame 20, a projection 20c protruding outward through a rising wall 20b is formed along an entire circumference thereof. A height $d_1$ of the rising wall 20b is set to be shorter than the thickness of the front case 2 and the rear case 3.

Figure 2:
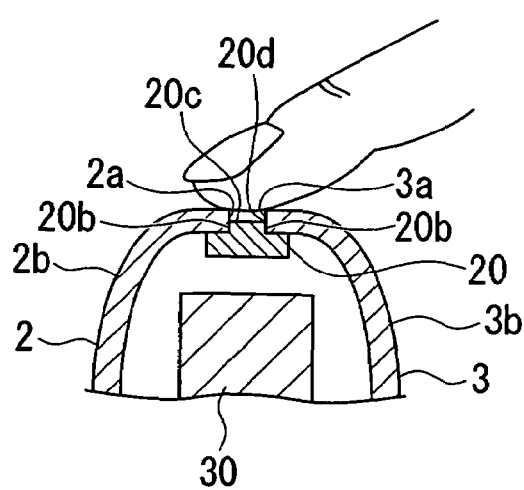
FIG. 2 is a sectional view of the digital camera of the first embodiment when the cases are assembled.

FIG. 2 is a sectional view of the digital camera of the first embodiment when the cases are assembled.

In the structure, when the front case 2 and the rear case 3 are combined together through the heat dissipation frame 20, as shown in FIG. 2, an end 2a of the front case 2 and an end 3a of the rear case 3 are fixed to sandwich the rising wall 20b from both sides, then a ceiling 20d of the projection 20c is exposed outside. Since the height $d_1$ of the rising wall 20b is set to be shorter than each thickness of the front case 2 and the rear case 3, the projection 20c is designed to be buried inward with respect to an outer surface 2b of the front case 2 and an outer surface 3b of the rear case 3.

Next, the way the digital camera 1 of the embodiment having this structure should be used will be explained.

When photographs are taken by the digital camera 1, the slide cover 9 is opened by the index finger with the digital camera 1 held in the hand to expose the lens 5. The lens 5 is directed to an object, the zoom lever 11 is operated depending on the situation, and confirming a shooting condition through a finder or a display (not shown) provided on the rear case 3, the shutter button 10 is pressed.

In contrast, when the digital camera 1 is carried not taking photographs, the slide cover 9 should be closed to cover the lens 5. Under this condition, the digital camera 1 can be put in a bag or a pocket. The slide cover 9 avoids the damage of the surface of the lens 5 when carrying the digital camera 1.

The digital camera 1 of the embodiment is assembled in a manner described below.

The front case 2 and the rear case 3 are combined with the heat dissipation frame 20, which is sandwiched therebetween respectively, placing the substrate 30 between them. Then, as shown in FIG. 2, the end 2a of the front case 2 and the end 3a of the rear case 3 sandwich the rising wall 20b from both sides. In this state, the front case 2 and the rear case 3 are fixed, when the ceiling 20d of the projection 20c is exposed outside because the end 2a of the front case 2 and the end 3a of the rear case 3 contact with the rising wall 20b, and because the end 2a and the end 3a do not contact with each other directly. Furthermore, because the height $d_1$ of the rising wall 20b is set to be shorter than each thickness of the front case 2 and the rear case 3, the projection 20c is designed to be buried inward with respect to the outer surface 2b of the front case 2 and the outer surface 3b of the rear case 3.

When the digital camera 1 is driven, the electronic components fixed on the substrate 30 consume electric power to generate the heat. The digital camera 1 of the embodiment dissipates the heat in the manner described below.

The heat generated by electric power consumption of the electronic components is transferred to each of the front case 2, the rear case 3, and the inner peripheral surface 10 of the heat dissipation frame 20. Because the front case 2 and the rear case 3 has low heat conductivity, the heat transferred to the inner surface of the front case 2 and the rear case 3 is not significantly conducted to the outer surface thereof, so that is difficult to dissipate outside. In contrast, because the heat dissipation frame 20 has high heat conductivity, the heat transferred to the inner peripheral surface of the heat dissipation frame 20 immediately reaches the ceiling 20d of the projection 20c passing through the inside. Since the ceiling 20d is exposed outside, the heat conducted to the ceiling 20d is dissipated outside therefrom. Because of this, the heat inside the digital camera 1 is dissipated.

As mentioned above, the digital camera 1 of the embodiment is constituted of the front case 2 and the rear case 3 made of a wooden material, utilizing natural features as a covering member. In addition, the digital camera 1 can readily dissipate the heat inside thereof through the projection 20c of the heat dissipation frame 20, improving heat dissipation efficiency and heat dissipation effect.

Moreover, placing a metal between the front case 2 and the rear case 3 can enhance strength of the covering member.

Since the ceiling 20d of the projection 20c is placed in a position to be buried inward with respect to the outer surface 2b of the front case 2 and the outer surface 3b of the rear case 3, an operator can avoid coming into contact with the hot heat dissipation frame 20 by mistake when he holds and operates the digital camera 1

EMBODIMENT 2

Figure 3:
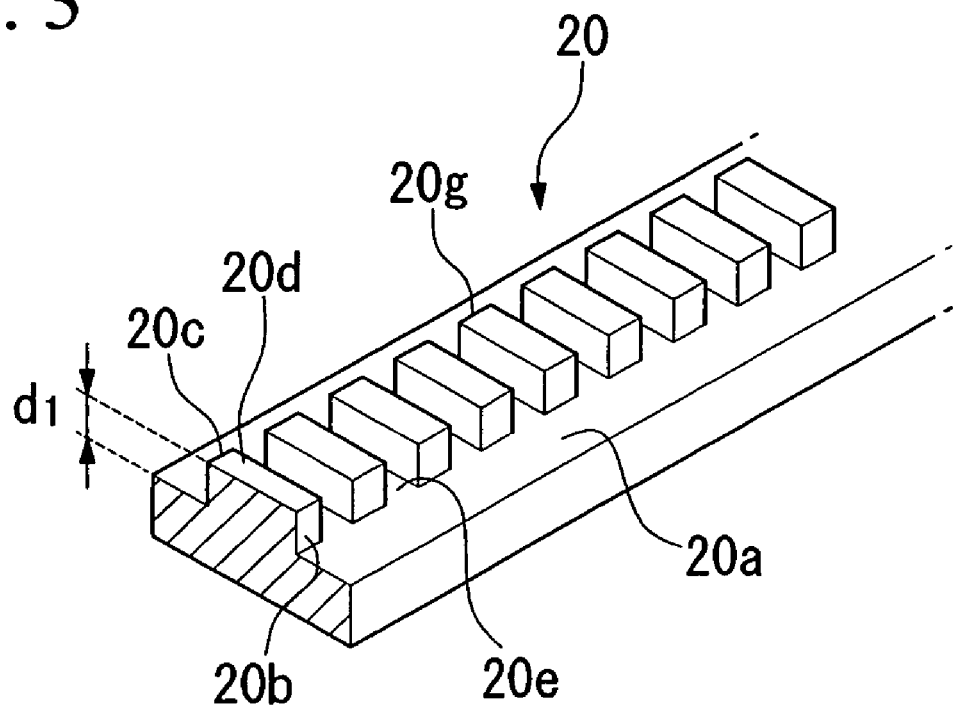
FIG. 3 is an explanatory figure of an essential portion for a second embodiment of a heat dissipation structure for electronic devices in accordance with the invention.

FIG. 3 shows a second embodiment in accordance with the invention and an essential portion of the heat dissipation frame 20.

In FIG. 3, the same reference numeral is used for corresponding structural elements as in FIG. 1, and explanation thereof is omitted.

The basic structure of the second embodiment is the same as that of the first embodiment. However, there is a difference only in the point below. That is, the heat dissipation frame 20 of the second embodiment includes a plurality of cutouts 20e on the projection 20c in the thickness direction of the heat dissipation frame 20, i.e., in the direction orthogonal to the circumference of the heat dissipation frame 20. According to this structure, a plurality of small projections (fins) 20g is provided along the overall circumference to increase the surface area of the projection 20c. Consequently, the heat transferred to the inner peripheral surface of the heat dissipation frame 20 within the digital camera 1 is dissipated by a large amount through the outer surface whose area is increased by the small projections 20g as well as though the ceiling 20d.

As described above, heat dissipation efficiency and heat dissipation effect are further improved.

EMBODIMENT 3

Figure 4:
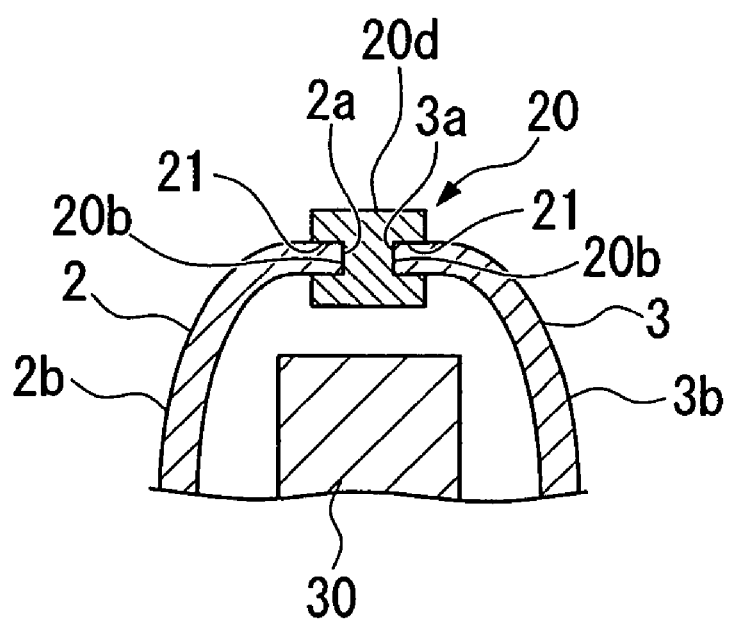
FIG. 4 is a sectional view of an essential portion for a third embodiment of a heat dissipation structure for electronic devices in accordance with the invention.

FIG. 4 shows a third embodiment in accordance with the invention.

In FIG. 4, the same reference numeral is used for the same structural element as in FIG. 2, and an explanation thereof is omitted.

The basic structure of the third embodiment is the same as that of the first embodiment. However, there is a difference only in the point shown below.

The heat dissipation frame 20 of the third embodiment includes a ceiling 20d expanded in the thickness direction referred to above, having a cross section of a letter H shape.

With this structure, when the front case 2 and the rear case 3 are combined together through the heat dissipation frame 20, the end 2a and the end 3b are engaged in a groove 21.

From the description above, the heat dissipation frame 20 can function as not only a dissipation structure for the heat of the inside of the digital camera 1 but also a joint for the front case 2 and the rear case 3. Moreover, the strength as a covering member can be enhanced.

EMBODIMENT 4

Figure 5:
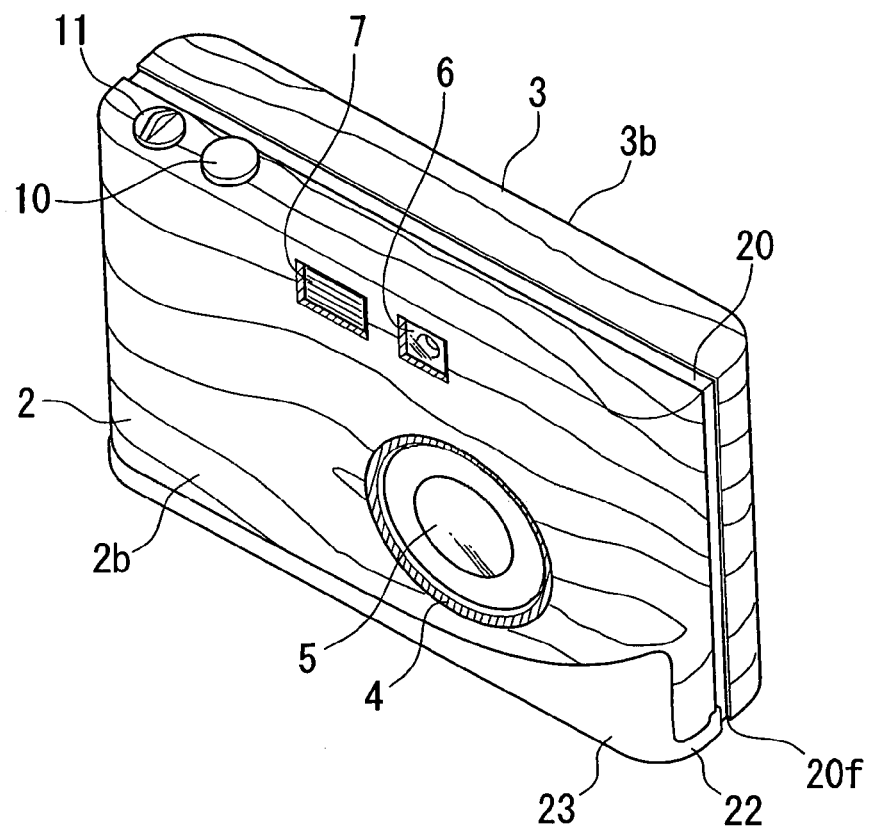
FIG. 5 is a perspective view of a fourth embodiment of a heat dissipation structure for electronic devices in accordance with the invention.
Figure 6:
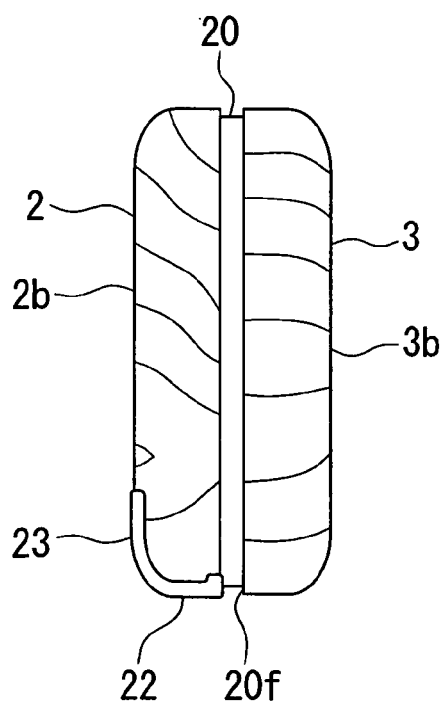
FIG. 6 is a side view of the fourth embodiment of a heat dissipation structure for electronic devices in accordance with the invention.

FIGS. 5 and 6 show a fourth embodiment in accordance with the invention.

In FIGS. 5 and 6, the same reference numeral is used for the same structural element as in FIG. 1, and an explanation thereof is omitted.

The basic structure of the fourth embodiment is the same as that of the first embodiment. However, there is a difference only in the point shown below. That is, the heat dissipation frame 20, as shown in FIG. 6, contains a base 22 extending in the thickness direction described above from an origin of a lower frame 20f, and a front wall (an accent portion) 23 folded upward with the head of the base 22 as an origin.

Under this structure, when the front case 2 and the rear case 3 are combined together through the heat dissipation frame 20, the lower end of the front case 2 is covered with the base 22, and as shown in FIG. 5, a part of the face of the front case 2 is covered with the front wall 23. Because of this, the front wall 23 constitutes a part of the design for front appearance of the digital camera 1.

From the description above, not only is the heat dissipation efficiency from the inside of the digital camera 1 enhanced, but also the design for the digital camera 1 is improved.

An explanation is made for a case in which the embodiments in accordance with the invention are applied to the digital camera. However, the embodiments in accordance with the invention should not be limited to the digital camera, and can be applied to other electronic devices.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The heat dissipation structure for electronic device in accordance with the invention can be applied to a covering member for electronic devices. When the covering member is made of a compressed wooden material, the electronic device can improve in heat dissipation efficiency.

What is claimed is:

1. A heat dissipation structure for an electronic device comprising:
    a plurality of covering members made of a compressed wooden material; and
    a metal heat dissipation frame held between the covering members, a portion of the heat dissipation frame being exposed outside of the electronic device,
    wherein the heat dissipation frame is formed in a frame shape provided with a hollow inner portion which is surrounded by the inner peripheral surface of the heat dissipation frame.

2. A heat dissipation structure as recited in claim 1, wherein the portion of the heat dissipation frame exposed outside includes at least one fin.

3. A heat dissipation structure as recited in claim 1, wherein the portion of the heat dissipation frame exposed outside is positioned inward with respect to the outer surface of the covering member.

4. A heat dissipation structure as recited in claim 1, wherein the portion of the heat dissipation frame exposed outside is provided as an accent to constitute a design for the covering material.

* * * * *